United States Patent
Horie et al.

(10) Patent No.: US 7,180,473 B2
(45) Date of Patent: Feb. 20, 2007

(54) ANTENNA WITH BUILT-IN FILTER

(75) Inventors: Ryo Horie, Tokyo (JP); Mitsuhiro Suzuki, Tokyo (JP); Shozaburo Kameda, Tokyo (JP); Koichi Fukuda, Ube (JP); Hiroshi Ichikawa, Ube (JP); Ryuji Oyama, Ube (JP)

(73) Assignees: Yokowo Co., Ltd., Tokyo (JP); UBE Industries, Ltd., Yamaguchi (JP)

( * ) Notice: Subject to any disclaimer, the term of this patent is extended or adjusted under 35 U.S.C. 154(b) by 0 days.

(21) Appl. No.: 10/468,809

(22) PCT Filed: Feb. 22, 2002

(86) PCT No.: PCT/JP02/01637

§ 371 (c)(1),
(2), (4) Date: Aug. 22, 2003

(87) PCT Pub. No.: WO02/067379

PCT Pub. Date: Aug. 29, 2002

(65) Prior Publication Data

US 2004/0070538 A1    Apr. 15, 2004

(30) Foreign Application Priority Data

Feb. 23, 2001  (JP) ............................ 2001-047902
Feb. 23, 2001  (JP) ............................ 2001-047903

(51) Int. Cl.
*H01Q 15/02*    (2006.01)
(52) U.S. Cl. ................. 343/909; 343/700 MS
(58) Field of Classification Search ........ 343/909, 343/700 MS, 702, 850, 853; 333/132
See application file for complete search history.

(56) References Cited

U.S. PATENT DOCUMENTS 5,554,960 A * 9/1996 Ohnuki et al. .............. 333/132

(Continued)

FOREIGN PATENT DOCUMENTS

CN            1252632        5/2000

(Continued)

OTHER PUBLICATIONS

Chinese Office Action issued Nov. 11, 2005 for Application No. 02805194.7.

(Continued)

*Primary Examiner*—Trinh Dinh
*Assistant Examiner*—Huedung Mancuso
(74) *Attorney, Agent, or Firm*—Rader, Fishman & Grauer PLLC

(57) ABSTRACT

At least one filter block (25, 35, 45) is formed in a thin and flat dielectric multilayer structure (21) and fixed with radiation elements (2, 3). Each filter block includes at least one of a low-pass filter, a high-pass filter and a band-eliminating filter. On the surface (one major surface) side and/or the side face of the multilayer structure, at least one radiation element (2, 3) being connected with the filter block is provided and feeding parts (28, 38, 48) for supplying signal to the radiation elements are provided on the rear surface of the multilayer structure. Consequently, the antenna and the filter block are integrated and a small surface mountable antenna with a built-in filter of a structure such that signals are not mixed each other even when signals of a plurality of frequency bands are transmitted/received can be obtained.

13 Claims, 6 Drawing Sheets

U.S. PATENT DOCUMENTS

| | | | |
|---|---|---|---|
| 5,898,403 A | 4/1999 | Saitoh et al. | |
| 6,111,544 A * | 8/2000 | Dakeya et al. | 343/700 MS |
| 6,130,645 A * | 10/2000 | Lindenmeier et al. | 343/704 |
| 6,351,239 B1 * | 2/2002 | Mizuno et al. | 343/700 MS |
| 6,542,050 B1 * | 4/2003 | Arai et al. | 333/134 |
| 6,781,557 B1 * | 8/2004 | Ueoka et al. | 343/873 |

FOREIGN PATENT DOCUMENTS

| | | |
|---|---|---|
| DE | 100 15 582 A1 | 11/2000 |
| DE | 100 15 583 A1 | 11/2000 |
| EP | 0621653 A2 | 10/1994 |
| EP | 0993069 A2 | 4/2000 |
| JP | 08-204431 A1 | 8/1996 |
| JP | 09-219315 | 8/1997 |
| JP | 11-041021 A | 2/1999 |
| JP | 11-122033 A | 4/1999 |
| JP | 11-317612 A | 11/1999 |
| JP | 2000-031724 A | 1/2000 |
| JP | 2000-151260 A | 5/2000 |
| JP | 2000-201015 A | 7/2000 |
| JP | 2000-286634 | 10/2000 |
| JP | 2000-286634 A1 | 10/2000 |
| JP | 2000-349680 A | 12/2000 |
| WO | WO-99/03168 A1 | 1/1999 |

OTHER PUBLICATIONS

EPO Search Report mailed on Mar. 9, 2006.

* cited by examiner

ANTENNA WITH BUILT-IN FILTER

This application is the National Phase of International Application PCT/JP02/01637 filed Feb. 22, 2002.

TECHNICAL FIELD

The present invention relates to an antenna with a built-in filter which has a filter having a superior separating function so as not to generate a noise on another signal because of reciprocal interference even when a plurality of frequency bands are transmitted or received at the same time, and which is small in size so as to be suitable for being mounted on a portable telephone, a personal digital assistant or the like, and in which matching is easy. More particularly, it relates to an antenna with a built-in filter having a compact structure in which reciprocal interference will not occur even if it is constituted such that signals of a plurality of frequency bands such as cellular and GPS or Bluetooth can be transmitted or received by one block of antenna.

BACKGROUND ART

Conventionally, signals transmitted or received by an antenna pass through a band-pass filter so that the antenna can transmit or receive a signal of a desired frequency band only. In such an antenna with a built-in filter, as its block diagram is shown in FIG. 9, a band-pass filter 84 is connected to a radiation element 81 through a connector 82 and a connection cable 83. As the filter connected to the antenna, when a steep damping characteristic is demanded, a coaxial resonant-type mono-block structured filter which is distribution constant filter is used, and when miniaturization is emphasized, a multilayer structured filter which is lumped constant filter is used. In general, however, the coaxial resonant-type mono-block structured band-pass filter is used.

If the distribution constant filter is used as the filter, since a size and a configuration corresponding to a wavelength to be used is required, the size is increased. Alternatively, if the multilayer structure filter is used, electrodes on the layers are connected to each other through a through-hole. However, a signal transmission path is locally narrowed in the connection using the through-hole, which increases high-frequency resistance or inductance and comes to increase in transmission signal loss or decline in the damping characteristic. Furthermore, in order to cut unnecessary electrical coupling between a plurality of circuit elements for the filter or transmission paths provided on a plurality of layers or on a surface of a layer, or unnecessary radiation, it needs to be shielded. Although the structure can be shielded in the vertical direction by providing an earth conductor film on the ceramic sheet, the shielding is not effective in the surface direction of the multilayer structure (in the direction parallel to the ceramic sheet) because an electric wave is leaked laterally from a gap of the connecting parts of the through-hole.

Meanwhile, in recent years, although as a radio device for cellular such as a portable telephone, two frequency bands such as Advanced Mobile Phone Service (AMPS for 0.8 GHz band in American standard) and Personal Communication Service (PCS for 1.8 GHz band in American standard which corresponds to PHS in Japan) are used, for example, the antenna for those tends to employ a dual band so as to be used for either frequency band. In addition, a system which can detect the place of the portable telephone by Global Positioning System (GPS) of 1.5 GHz band is thought. In addition, the terminal for cellular and a personal computer or the like tend to be connected by short-distance radio by worldwide standard of Bluetooth (BT for 2.45 GHz band). Thus, there is a demand for the antenna which can transmit or receive the signal of any frequency band among them in the portable telephone or the like.

In this case, as FIG. 10 illustrates a case where the antennas are disposed in the portable telephone, it is thought that the antennas for cellular and GPS are disposed at upper portions of the portable telephone and the antenna for BT is disposed at the lower portion of it. However, since further miniaturization is demanded in the portable device, to provide the antennas at various places in the portable device is contrary to the demand for the miniaturization.

As described above, according to the conventional antenna with a built-in filter, since the antenna and the band pass filter are connected through the connector and connection cable, the device becomes large and loss is increased. In addition, since the radiation element and the filter separately function, it is necessary to match the impedance of the radiation element, which further increase its size. Therefore, in view of reduction of the transmission loss and miniaturization of the device and further in view of the fact that an optimum performance can be obtained without matching the antenna to the filter on the user side, the antenna is preferably integrated with the filter.

Meanwhile, as described above, although there is a demand that the antenna which can be used for the plurality of frequency bands is mounted on a small portable device, according to the various applications, the distribution constant filter such as coaxial resonant-type mono-block structured filter and the lumped constant filter such as multilayer structured filter may exist together. However, if such different type filters are manufactured at the same time, since the manufacturing steps are different, the cost is increased and a size is increased because of the mono-block structure.

Furthermore, according to the above-described band-pass filter, as the frequency band is increased, the shielding characteristic deteriorates, and there can not be provided a broadband band-pass filter having superior shielding characteristic.

In addition, as described above, if the antennas for the plural frequency bands have integrally the filter built-in, it means that the radiation elements for the plural frequency bands such as cellular and GPS or BT and the band-pass filter are arranged together at one place, they are interfered with each other or the signal of another frequency band could be mixed in. In other words, as for the dual band antenna for cellular, since both are not used at the same time, reciprocal interference does not matter so much. However, there is a case where the antennas for cellular, GPS and Bluetooth are used at the same time, which could cause the reciprocal interference and lower the antenna performance.

Especially, the band-pass filter passes spurious which is an integral multiple of the frequency of the signal to be passed so that a noise is likely to enter. Therefore, for example, if the signal for AMPS of 0.8 GHZ is transmitted or received, since the signal for GPA of 1.5 GHz and the signal for BT of 2.45 GHz are about twice and triple of the frequency of the signal of AMPS, they are likely to enter as the spurious.

The present invention was made so as to solve the above problems and it is an object of the present invention to provide an antenna with a built-in filter having a structure in which an antenna and a filter are integrated while the filter formed of multilayer structure is miniaturized, and signals are not interfered to each other even when signals of a plurality of frequency bands are transmitted or received.

It is another object of the present invention to provide an antenna with a built-in filter having a structure in which a filter characteristic does not deteriorate by the reciprocal interference with a simple structure even when signals of a plurality of frequency bands are transmitted or received.

It is a further object of the present invention to provide an antenna with a built-in filter having a concrete structure in which a configuration is small, surface mounting is possible, antenna for plurality of frequency bands is combined and reciprocal interference can be prevented.

It is a still another object of the present invention to provide an antenna with a built-in filter in which the filter prevents high-frequency resistance or inductance from increasing while the filter built in the antenna is made small.

It is still a further object of the present invention to provide a concrete structure for integrating antenna with a built-in filter for cellular, GPS (Global Positioning System), Bluetooth or the like.

It is still a further object of the present invention to provide a dielectric multilayer structure in which when an electric circuit is formed in a multilayer structure of a dielectric material, elements formed on each of different layers are connected electrically without generating loss in the high frequency, or a shield characteristic of the surface direction in the multilayer body can be improved.

DISCLOSURE OF THE INVENTION

An antenna with a built-in filter according to the present invention has a structure in which a desired frequency band is passed and it includes a dielectric multilayer structure formed such that dielectric sheets with an electroconductive film formed on its one surface are laminated to constitute at least one filter block, and a radiation element fixed to the dielectric multilayer structure and connected to the filter block, wherein the filter block includes at least one of a low-pass filter, a high-pass filter and a band-elimination filter.

Here, the filter block means a filter group corresponding to the radiation element of one frequency band and includes a case in which there is one filter.

According to this structure, there can be provided the filter which passes a desired frequency band by combining the high-pass filter and low-pass filter, for example and its band width can be freely set. In addition, if necessary, a specific frequency band can be removed and only a desired frequency band can be passed. Furthermore, since the radiation element is fixed to the dielectric multilayer structure and it is directly connected to the filter, impedance between them can be matched easily, connection wiring is short, and loss can be considerably reduced, whereby there is provided the antenna with the built-in filter with high efficiency.

Two or more filter blocks are formed in the dielectric multilayer structure so as to be able to transmit or receive signals of two or more frequency bands, and one of the filter blocks is formed in a combination of any of the low-pass filter, the high-pass filter and the band elimination filter so as to cut a frequency band of a signal of the signals which is different from a signal which passes through the one of the filter blocks. Thus, even when the radiation elements for cellular and GPS or BT and the filters are formed in one block, reciprocal interference of signals will not occur and the filter blocks can transmit or receive the signals with low noise.

According to another aspect of the present invention, an antenna with a built-in filter includes; a thin and flat dielectric multilayer structure formed such that dielectric sheets with an electroconductive film formed on its one surface are laminated to constitute at least one filter block, at least one radiation electrode provided on a main surface side and/or side surface of the dielectric multilayer structure and connected to the filter block, and a feeding part for supplying a signal to the radiation electrode provided on a back surface of the dielectric multilayer structure. Here, the main surface side means to include a case where it may be provided apart from the main surface at a certain interval or in the dielectric block, other than the case where it is provided directly on the main surface.

According to the above structure, the filter is formed of a thin and flat dielectric multilayer structure, the radiation electrode is formed on its side surface, a surface (main surface) or its surface side, and the feeding part is formed on the back surface (opposite to the main surface) or the side surface of the multilayer structure to constitute the antenna. Thus, a very thin antenna with a built-in filter can be provided, which can be easily attached to the portable telephone or the personal digital assistant with small place. In addition, as will be described later, the antennas for cellular, GPS, Bluetooth (BT) or the like can be mounted on this dielectric multilayer structure so that the antennas for four frequency bands can be combined on the flat dielectric multilayer structure.

The electroconductive films provided above and below through the dielectric sheet in the dielectric multilayer structure are connected as a plate-form connection through a band-shaped via contact formed in the dielectric sheet. Thus, a sectional area at the connection part is considerably increased as compared with the conventional through hole. As a result, resistance or inductance is not increased even in the high frequency and a very high-performance filter circuit can be obtained. Here, band-shape means that a cross-section of the via contact (connection part) is band-shaped in which the horizontal to vertical ratio in section is about 2 times or more, for example.

More specifically, at least one radiation electrode is provided on the side surface or the main surface in the vicinity of the side surface of the dielectric multilayer structure, a feed electrode is provided on the side surface or the main surface thereof so as to be coupled to the radiation electrode by capacitive coupling and the feed electrode is connected to a feeding part provided on the back surface of the dielectric multilayer structure through the filter block. As a result, the antenna with the built-in filter can be formed almost without taking space as the antenna.

An earth conductor is not provided on the main surface, the back surface opposite to the main surface and the side surface of the dielectric multilayer structure in the vicinity of the radiation electrode and the feed electrode. As a result, an electric distance between the radiation electrode or the feed electrode and the earth electrode can be secured so that the antenna radiation resistance is not unnecessarily lowered and high antenna efficiency and broadband antenna characteristic can be provided. Here, the vicinity means a range of ½ to 2 times of the width of the radiation electrode from the radiation electrode.

The earth conductor is provided on the main surface of the dielectric multilayer structure except for the part in the vicinity of the radiation electrode, and a feed electrode for connecting to the radiation electrode is derived to a part of the main surface so as to be apart from the earth conductor. Thus, the antenna for cellular, for example can be constituted by connecting a flat-shaped radiation electrode, a rod-shaped radiation electrode (element), coil-shaped radiation electrode (element) or the like to the feed electrode.

For example, the radiation electrode is provided on the side of the main surface of the dielectric multilayer structure through an insulating support and space and the radiation electrode is connected to the feed electrode and to the earth conductor of the dielectric multilayer structure at a position in which impedance of the radiation electrode matches. Thus, a flat plate shape of antenna for dual band cellular can be constituted.

More specifically, two or more radiation electrodes are provided in at least two positions of two opposite side surfaces and the main surface of the dielectric multilayer structure so as to be able to receive, at least, signals of two or more frequency bands and two or more filter blocks are electrically coupled to the respective two or more radiation electrodes and formed in the dielectric multilayer structure.

Two or more filter blocks are formed so as to be able to transmit or receive signals of two or more frequency bands, and the two or more filter blocks are formed so as not to interfere with each other by a shielding wall formed in the direction vertical to a dielectric sheet of the dielectric multilayer structure through a band-shaped via contact formed in the dielectric sheet. Thus, even when filter circuits for plural frequency bands are formed in the dielectric multilayer structure, they can be blocked off with each other, and reciprocal interference can be prevented. As a result, even when the small dielectric multilayer structure and the radiation electrodes for plural frequency bands are formed in the vicinity thereof, they can function as very high-characteristic antennas, respectively and small and high-performance combined antenna can be provided.

More specifically, the radiation element formed on the side surface or the main surface of the dielectric multilayer structure is for global positioning system or BT and the radiation electrode provided on the main surface side and connected to the feed electrode is for cellular.

One antenna element is folded so that at least two portions in which adjacent elements are electrically coupled respectively are formed, the radiation electrode is formed from the antenna element so as to resonate in the desired four frequency bands by adjusting the electrically coupled portion and so that one end of the antenna element is connected to filters of the respective frequency bands through a multiplexer. As a result, the one radiation electrode is provided for four frequency bands of cellular, GPS and BT, thereby to miniaturize it with further simple structure.

The dielectric multilayer structure according to the present invention is the dielectric multilayer structure in which the plural dielectric sheets each having an electroconductive film thereon are laminated and fixed, in which electroconductive films provided on upper and lower sides of a dielectric sheet are connected and a shield wall is formed in the dielectric multilayer structure in its thickness direction by forming a band-shaped via contact in the dielectric sheet. According to this constitution, even in the multilayer structure in which the electroconductive film is formed on the dielectric sheet, the electroconductive films can be connected through the ceramic (dielectric) sheet with low resistance and it can be completely shielded in the horizontal direction of the ceramic sheet. As a result, a high-performance circuit element which is compact in configuration and will not be subjected to the reciprocal interference, is obtained.

In addition, according to this structure, a shield wall can be formed in the periphery and coaxial lines can be formed.

In this case, the signal lines can be thick by connecting over two or more layers, whereby the higher-frequency circuit can be formed of the multilayer structure. As a result, a coaxial resonator can be also formed of the multilayer structure.

BEST MODE FOR CARRYING OUT THE INVENTION

Figure 1A:
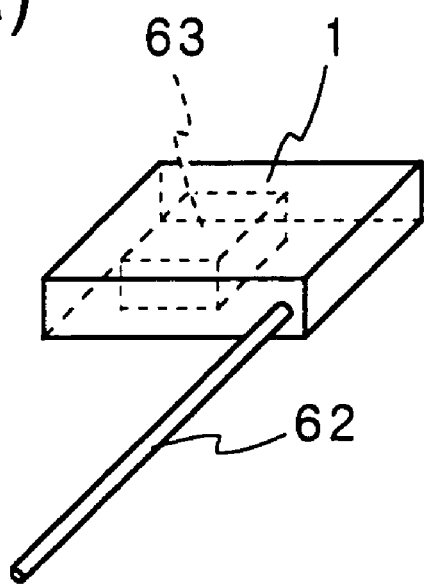
FIGS. 1(a) and (b) are explanatory views showing an antenna with a built-in filter according to an embodiment of the present invention.
Figure 1B:
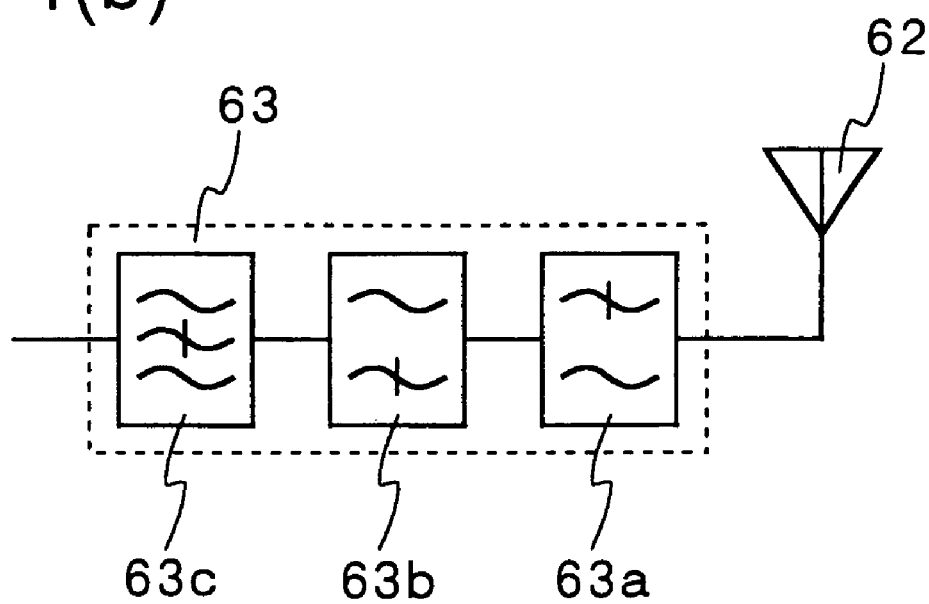

Then, an antenna with a built-in filter according to the present invention will be described with reference to the drawings. According to the antenna with a built-in filter of an embodiment of the present invention, as a structural view and a block diagram thereof is shown in FIG. 1, a dielectric multilayer structure 1 is constituted in such a manner that dielectric sheets 11 (referring to FIG. 2(a)) on which an electrodoncutive film is formed are laminated so as to constitute at least one filter block 63. A radiation element 62 is attached to the dielectric multilayer structure 1 and the radiation element 62 is connected to the filter block 63. The filter block 63 includes at least one of a low-pass filter 63a, a high-pass filter 63b and band-elimination filter 63c. Although only one radiation element 62 and one filter block 63 are shown in FIG. 1, as described above, a plurality of radiation elements and a plurality of filter blocks 63 may be attached to or built in the dielectric multilayer structure 1 so as to be able to receive or transmit signals of a plurality of frequency bands.

Figure 2A:
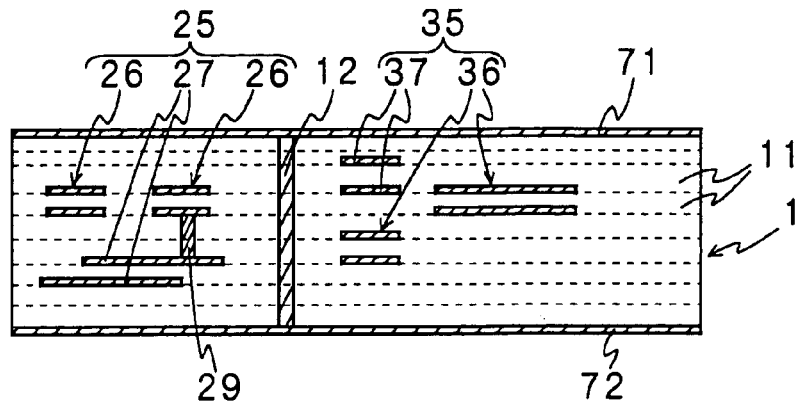
FIGS. 2(a) to (c) are sectional views showing an example of a dielectric multilayer structure shown in FIG. 1 and an explanatory view showing an example in which a filter is formed.
Figure 2B:
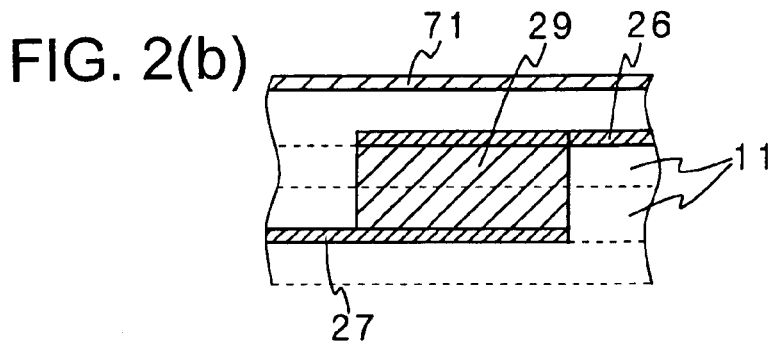
Figure 2C:
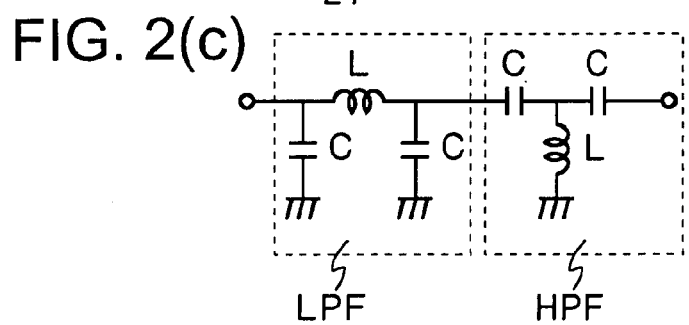

As shown in FIG. 2(a), the dielectric multilayer structure 1 is formed in such as manner that an electroconductive film is formed on one surface of a ceramic (dielectric) sheet (green sheet) 11, for example, into a desired configuration by printing or the like, and into a desired pattern so as to form strip lines 27 and 37 constituting an inductor (L) or the like and capacitors (C) 26 and 36 by forming the electroconductive film across the dielectric sheet 11, and the ceramic sheets having electroconductive films 71 and 72 on its upper surface and its lower surface, respectively are superimposed and pressed to be cut and sintered. The dielectric multilayer structure 1 is about 3.5 cm×2 cm in size and 2 to 7 mm in thickness. The low-pass filter LPF and the high-pass filter HPF can be constituted by connecting the L and C as shown in FIG. 2(c), for example. Another filter can be formed only by changing a magnitude or a connection of the L and C. In addition, the electroconductive films 71 and 72 on the upper and lower surfaces are grounded to serve as a shield plate.

When the upper and lower conductive films are connected across the ceramic sheet 11, they are connected by a via contact 29 formed by burying an electric conductor in a contact hole formed in the ceramic sheet 11. The via contact 29 is formed into a band shape in which it is about 0.1 mm in thickness and 1 to 2 mm in width, for example as its sectional view is shown in FIG. 2(b) which is vertical to FIG. 2(a). The width can be freely set according to a width and a characteristic of a wiring (strip line). Since the via contact is plate-form, a sectional area of connection is enlarged and high-frequency resistance or the inductance is prevented from increasing. As a result, while the filter is formed of the multilayer structure, high-characteristic filter can be formed. The band shape (plate-form) is not limited to the one whose horizontal (width) to vertical (thickness) ratio in section is 10 times or more as in the above example and it means that the horizontal (width) to vertical (thickness) ratio in section is about 2 times or more. The band-shaped via contact is formed by forming the contact hole provided in the ceramic sheet into an elongated groove shape.

According to the example shown in FIG. 2(a), a filter block 25 for BT and a filter block 35 for GPS to be described later are formed and a shield wall 12 is formed between them so that two blocks are shielded with each other. Like the above-mentioned via contact, the shield wall 12 is formed in such a manner that an elongated contact hole having a width necessary for shielding is formed at the same place of each ceramic sheet, an electric conductor is buried in the contact hole, and the ceramic sheets are superimposed, pressed, cut and sintered.

Although there is a case where the filter block is constituted by a plurality of filters such as the filter block 25 for BT and the filter block 35 for GPS shown in FIG. 6 to be described later, there is a case where it is constituted by one filter only. In addition, when a plurality of frequency bands are transmitted or received, mixture or interference of noise can be prevented by selecting and forming a filter so as to remove a frequency band of a signal of the other.

The above dielectric multilayer structure 1 is manufactured in such a manner that an elongated groove for a via contact is formed by die in the ceramic sheet 11 having a thickness of about 100 μm, for example, and strip lines are formed at necessary positions and conductive material is buried in the groove by printing. Then, in order to form a filter circuit as described above, several tens of the ceramic sheets are pressed and cut into individual dielectric multilayer structure or a groove for cutting is formed and then, they are sintered. In addition, when a radiation element or an earth conductor is formed on the side to be described later, the electric conductor is printed on the side surface.

Figure 3:
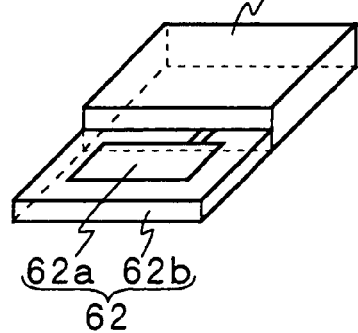
FIG. 3 is an explanatory view showing another constitution of a radiation element.

As the radiation element 2, a linear radiation element such as a rod antenna or a helical antenna is used in the example shown in FIG. 1. However, as shown in FIG. 3, the radiation element 62 referred to as a patch antenna in which a predetermined size of electroconductive film 62a is formed on a dielectric substrate 62b can be used. Furthermore, as will be described later, the radiation element may be formed of a dielectric antenna in which a radiation electrode and a feed electrode are coupled to the surface or side surface of the dielectric multilayer structure by capacitive coupling, or may be formed by an outer radiation electrode connected to a feeding part of the dielectric multilayer structure through electroconductive connecting means.

According to the present invention, the filter block is formed of the dielectric multilayer structure in which the dielectric sheets such as the ceramic sheets are laminated. Since the radiation element is formed directly in the dielectric multilayer structure in contact with the filter block or attached in the vicinity thereof, impedance matching can be integrally performed so that it is not necessary to provide a specific matching circuit in the radiation element and a connection cable or connector is not necessary, thereby to be compactly formed with high efficiency.

Furthermore, as a concrete example shown in FIG. 6 to be described later, if not only a band-pass filter which passes a predetermined frequency but also at least two of a low-pass filter, a high-pass filter and a band-elimination filter are combined and used to remove the frequency of the other signal which is likely to be transmitted or received at the same time and mixed, even when antennas of plural frequency bands are adjacently provided, noise caused by the interference can be removed. As a result, antennas for a plurality of applications can be mounted on a portable device such as a portable telephone in which miniaturization is strongly demanded, without taking up lots of space and the antenna for a global positioning system or BT other than cellular can be integrally formed.

Furthermore, if the shield wall is formed between the filter blocks, shielding in the direction parallel to the dielectric sheet in the dielectric multilayer structure can be surely performed and almost the whole periphery can be shielded. As a result, the whole periphery of the respective filter blocks connected to the antennas of the plural frequency bands can be almost completely shielded and even if the antennas of the plural frequency bands and filters are integrally formed to be compact, reciprocal interference can be completely prevented.

Then, referring to FIG. 4, a description of an embodiment of an antenna with a built-in filter of a concrete structure using this dielectric multilayer structure will be made, in which a combined antenna of four frequency bands for Bluetooth, GPS, dual cellular such as AMPS/PCS, for example is suitably formed. According to the antenna with the built-in filter of this embodiment of the present invention, as shown in FIG. 4, the same dielectric multilayer structure 1 as shown in FIGS. 1 and 2 is formed to a thin and flat configuration in which the dielectric sheets 11 (referring to FIG. 2(a)) with the electroconductive film formed on its one surface are laminated so as to constitute at least one filter block. At least one of radiation elements 2 to 4 to be connected to the filter block is provided on the surface (main surface) and/or side surface of the dielectric multilayer structure 1 and feeding parts (input/output terminals) 28, 38 and 48 which can feed a signal to the radiation elements 2 to 4 are provided on the back surface of the dielectric multilayer structure 1. In addition, FIGS. 4(b), (c) and (d) are a left side view, a bottom view and a back view of FIG. 4(a), respectively.

In an example shown in FIG. 4, although the combined antenna is shown, all of radiation elements are not necessarily mounted and one or more desired radiation elements can be mounted. The dielectric multilayer structure 1 is formed as shown in FIGS. 2(a) and (b). In this structure, in order to constitute the antenna with the built-in filter corresponding to the above four frequency bands, for example, it is formed to be about 20 mm by 30 mm square and about 1 to 2 mm in thickness. According to the example shown in FIG. 2(a), the filter block 25 for BT includes the capacitors 26 and strip lines 27 and the filter block 35 for GPS includes the capacitors 36 and the strip lines 37.

According to an example shown in FIG. 4, earth conductors 71 and 72 are formed on the main surface and the back surface of the dielectric multilayer structure 1 except for one part. In addition, the earth conductors 73 and 74 are provided on the side surfaces on which the radiation elements 2 and 3 are not provided except for the feeding part. The earth conductors 71, 73 and 74 on the main surface and side surfaces function as shielding plates so as to prevent a noise from entering the filter blocks 25, 35 and 45, and in a case where an antenna for cellular to be described later is provided on an upper part of the earth conductor 71, they also function as its bottom board. If there is an earth plate in a mother board on which the antenna is mounted, since the filter is also shielded, the earth conductor 72 on the back surface is not always necessary and it is not provided in some cases.

The part, the above "except for one part" on which the earth conductors 71 and 72 are not provided means parts A and B in the vicinity of parts (parts of radiation elements 2 and 3) where the radiation electrodes 21 and 31 and the feed electrodes 22 and 32 for BT and GPS are provided, and its width is ½ to 2 times as long as that of the radiation electrode width. If the radiation electrodes 21 and 31 and the feed electrodes 22 and 32 are provided not on the side surface of the multilayer structure but at an end portion of the main surface, the earth conductor is similarly removed at the portion and corresponding part of its periphery (side surface) and the back surface.

In addition, if there is an earth plate on the mother board to which the antenna is attached, the appropriate portion on the earth plate is preferably removed. The reason why the earth conductors 71 and 72 are removed in the vicinity of the radiation electrodes 21 and 31 and the feed electrodes 22 and 32 is that if the earth conductor exists in the vicinity of the radiation electrodes 21 and 31, an electric distance between the radiation electrode and the earth conductor is reduced and antenna radiation resistance and antenna efficiency are lowered. Thus, the distance has to be secured to avoid the above.

The radiation element 2 for BT and the radiation element 3 for GPS includes the radiation electrodes 21 and 31, and the feed electrodes 22 and 32 for generating resonance by capacity-coupling with one ends of the radiation electrodes 21 and 31, respectively. The filter block 25 for BT and the filter block 35 for GPS are connected to the feed electrodes 22 and 32 through connection patterns 23 and 33 formed on the inner multilayer sheet, respectively. The other ends of the filter blocks are connected to input output terminals 28 and 38, respectively. According to the example shown in FIGS. 4(c) and (d), although the input/output terminals 28 and 38 are formed on the side surface and the back surface of the dielectric multilayer structure 1, if they are provided at least one of the back surface and the side surface, when they are mounted on a substrate such as a mother board in a portable telephone or the like, they can be mounted on the surface directly by soldering or the like. In addition, the input/output terminal 28 for BT is a transmission and reception combined terminal TRX and the input/output terminal 38 for GPS is a reception terminal RX. The radiation element 2 for BT and the radiation element 3 for GPS may be provided on the surface (main surface) instead of on the side surface.

Figure 5A:
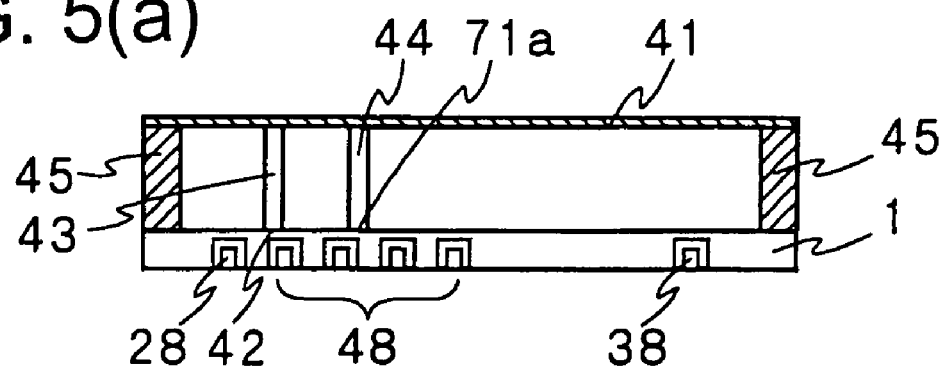
FIGS. 5(a) and (b) are explanatory views showing an example of a radiation electrode for cellular shown in FIG. 4.
Figure 5B:
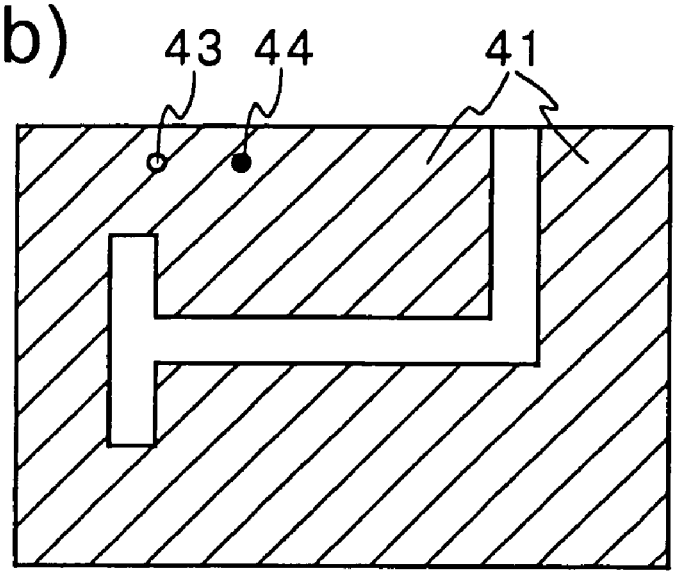

According to the radiation element 4 for cellular, as the flat-shaped antenna which is an example of the dual antenna for AMPS/PCS, for example is shown in FIG. 5, a feed electrode 42 formed on the surface of the dielectric multilayer structure 1 is connected to an outer radiation electrode 41 through electroconductive connecting means 43, and a part of the outer radiation electrode 41 is electrically connected to a part 71a of an earth conductor 71 on the surface side of the dielectric multilayer structure 1 through electroconductive connecting means 44 in order to implement impedance matching of the outer radiation electrode 41 and the radiation electrode is held by an insulating supporting mechanism 45. If a spring contact pin (pogo pin) is used as the electroconductive connecting means 43 and 44 for supporting and fastening the outer radiation electrode 41 to the dielectric multilayer structure 1, the outer radiation electrode 41 is detachable and the outer radiation electrode 41 can be mounted after the dielectric multilayer structure 1 is mounted on the mother board, which is very convenient.

Furthermore, although the size of the dielectric multilayer structure 1 in the antenna shown in FIG. 5 is the same as the above, when the radiation electrode for cellular is provided on its surface, the whole thickness is about 7 mm (the thickness of the dielectric multilayer structure 1 is about 2 mm). According to the example shown in FIG. 5, although the dual antenna for AMPS (0.8 GHz) and for PCS (1.8 GHz) is formed into a plane radiation electrode pattern, it may be another antenna pattern constituting the dual band for cellular, or it may be a structure in which a rod antenna, a meandered antenna or a folded antenna in which a wire-shaped radiation electrode is adjusted so as to resonate in desired frequency bands by coupling adjacent elements, is connected to the feed electrode 42 (which may be provided on the side surface of the dielectric multilayer structure 1).

Figure 4A:
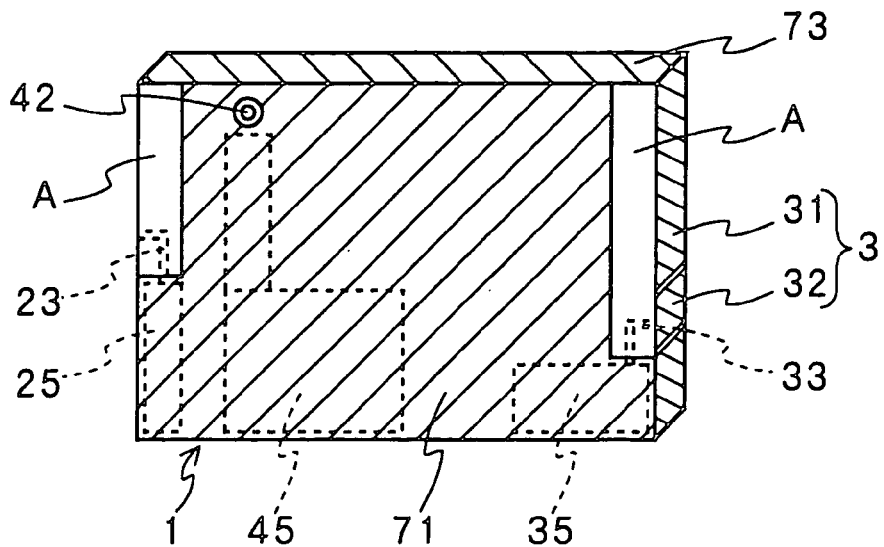
FIGS. 4(a) to (d) are explanatory views showing an antenna with a built-in filter according to another embodiment of the present invention.
Figure 4B:
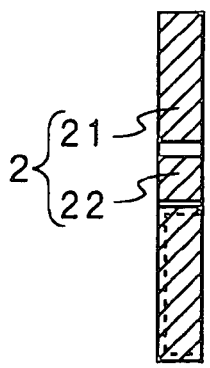
Figure 4C:
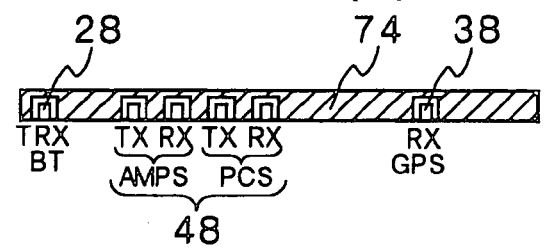
Figure 4D:
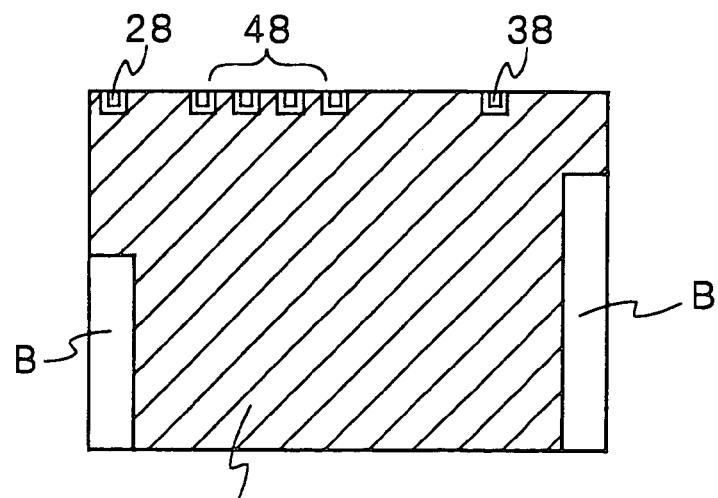

The other end of the feed electrode 42 is connected to the filter block 45 formed in the dielectric multilayer structure 1, and the other end portion of the filter block is connected to the input/output terminal 48 formed from the side surface to the back surface of the dielectric multilayer structure 1 as shown in FIGS. 4(c) and (d). In addition, the input/output terminal 48 includes the transmission terminal TX and reception terminals RX for respective AMPS and PCS.

Figure 6:
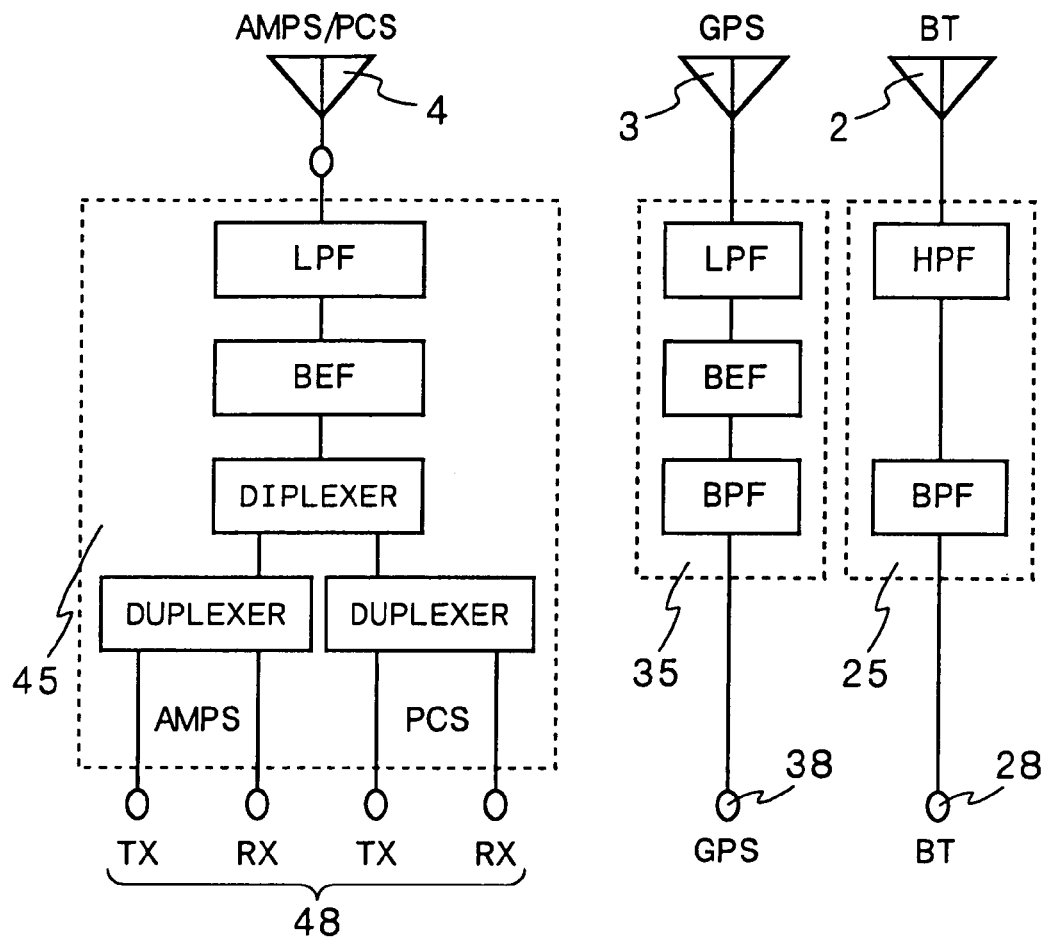
FIG. 6 is an explanatory view showing an example of a constitution of a filter block of each frequency band shown in FIG. 4.

The filter blocks 25, 35 and 45 of respective frequency bands are formed by the capacitor and the inductance of the strip line provided in the dielectric multilayer structure as shown by the block diagram in FIG. 6. In this case, since one filter block includes the low-pass filter, high-pass filter and band-elimination filter so as to shield the frequency band of the signal passing through other filter blocks. As a result, even if the radiation elements for cellular and for GPS or BT and the filter blocks are formed in one block, signals do not interfered with each other so that transmission and reception can be performed with low noise.

According to the filter block 25 for BT (2.45 GHz), since its frequency band is higher than those of the filter blocks for cellular (0.8 GHz and 1.8 GHz) and for GPS (1.5 GHz), if only the high-pass filter HPF which passes the frequency band higher than 1.8 GHz, more preferably higher than 2.4 GHz is inserted, the signals of others which are noise are all eliminated and not mixed. In this example, however, in order to remove another noise of signals other than the above, the band-pass filter BPF is also provided like in a conventional example.

In addition, according to the filter block 35 for GPS, since its frequency band is lower than that for BT and close to that for PCS, it includes the low-pass filter LPF which cuts the frequency band higher than 1.6 GHz, for example to exclude the BT band, the band-elimination filter BEF of 1.8 GHz band which excludes the PCS band close to 1.5 GHz, and the band pass filter BPF for removing the other noises.

Furthermore, according to the filter block 45 for cellular (AMPS/PCS), similarly, it includes the low-pass filter LPF for excluding the BT band, the band-elimination filter BEF for excluding the GPS band, a diplexer (DIPLEXER) for separating AMPS and PCS, and duplexer (DUPLEXER) for separating the signals to the transmission signal frequency band TX and the reception signal frequency band RX to be connected to the input/output terminal 48.

A positional relation between the filter blocks 25, 35 and 45 formed in the dielectric multilayer structure 1 is separated in plane as shown by dotted lines in FIG. 4(*a*) and the whole area occupied by them is about 2 cm² (the surface area of the multilayer is about 2 cm×3 cm). If the above-mentioned shield wall is vertically formed between the filter blocks, the reciprocal interference can be completely prevented in the whole periphery. In addition, the constitution of the filter blocks 25, 35 and 45 is not limited to the above example and another filter can be combined.

When thus formed antenna is attached to the mother board of the portable telephone or the like, if the dielectric multilayer structure is mounted on the upper end portion of the mother board (upper portion of the portable telephone, for example), the above-mentioned radiation electrode is preferably arranged on the upper side and/or side surface of the mother board because the signals can be received without loss by attaching the radiation electrode such that it looks to the outside of the portable telephone or the like.

According to this embodiment of the present invention, since the filter block is formed by the very thin and flat dielectric multilayer structure in which the dielectric sheets such as ceramic sheets are laminated, and the antenna is directly formed in the dielectric multilayer structure or attached in the vicinity of it, a compact configuration can be implemented and the antenna for the global positioning system or for BT other than cellular can be integrally formed. As a result, the radiation elements for plurality of applications can be mounted without taking up space in the portable device such as the portable telephone which is strongly demanded for miniaturization.

In addition, according to the dielectric multilayer structure of the present invention, the electroconductive films between multilayers are connected through the band-shaped via contact, deterioration of performance caused by an increase of high frequency resistance or inductance in the conventional multilayer structure is not generated. As a result, filter processing (function) can be performed with high performance.

Furthermore, since the band-shaped via contact is used in the dielectric multilayer structure of the present invention, shielding in the direction parallel to the dielectric sheet in the multilayer structure can be surely performed so that the almost whole periphery can be shielded as described above. Consequently, since the whole periphery of the filter block connected to the antennas of the plural frequency bands can be completely shielded, even if the antennas of the plural frequency bands and their filters are integrally and compactly formed, reciprocal interference can be completely prevented.

Figure 7A:
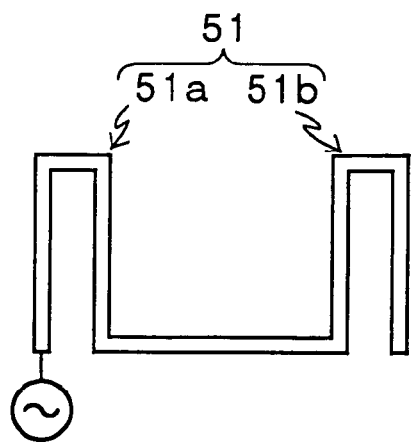
FIGS. 7(a) and (b) are explanatory views showing an example in which the radiation electrode of four frequency bands shown in FIG. 4 is formed of one antenna element.
Figure 7B:
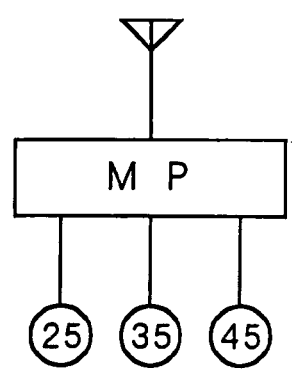

In the above example, although multi elements multi feeds (MEMF) in which the radiation electrodes for BT, GPS and cellular are separately formed and arranged in the periphery of the dielectric multilayer structure is shown, there can be provided single element single feed (SESF) in which an antenna element is folded so as to be coupled to the adjacent element in capacity and/or induction and resonance is generated in the plural frequency bands while feeding is performed by one point of one element. In this structure, the resonance can be generated in the above-mentioned four frequency bands by adjusting the distance between the adjacent elements or the like. For example, as shown in FIG. 7(*a*), the first two elements 51*a* and the next two elements 51*b* are coupled, respectively but coupling is not performed between the first two elements 51*a* and the next two elements 51*b*. By adjusting the degree of coupling between the respective two elements, the radiation electrode 51 can resonate in the above-mentioned four frequency bands with one feeding.

If thus structured radiation electrode is used, transmission and reception can be performed with one radiation electrode 51 by connecting respective filter blocks formed for respective frequency bands. In this case, as shown in FIG. 7(*b*), a multiplexer MP is connected to the radiation electrode 51 and frequency bands are respectively separated. Only the signal of respective frequency bands is connected to the respective filter blocks 25, 35 and 45.

Figure 8A:
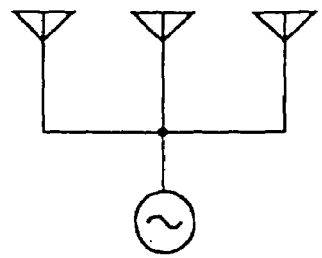
FIGS. 8(b) (b) are explanatory views showing another example of the relation between a radiation element and a feeding part.
Figure 8B:
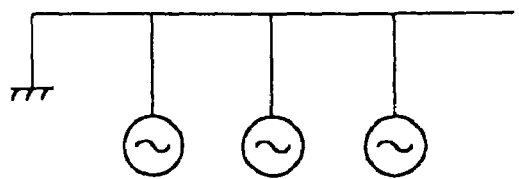
Figure 9:
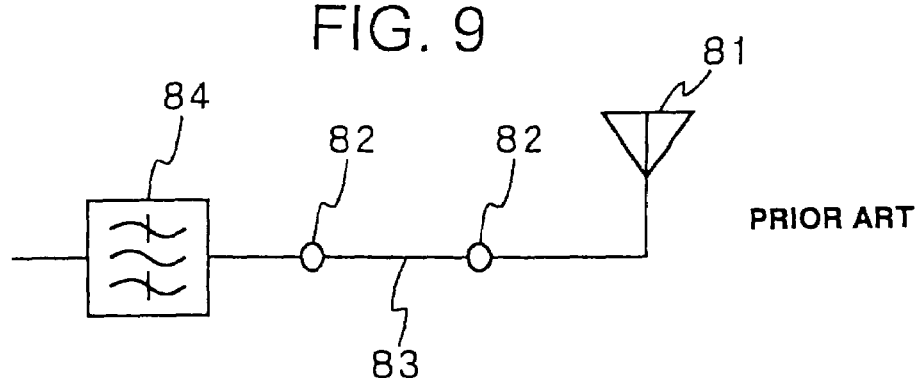
FIG. 9 is an explanatory view showing a conventional antenna with a built-in filter.
Figure 10:
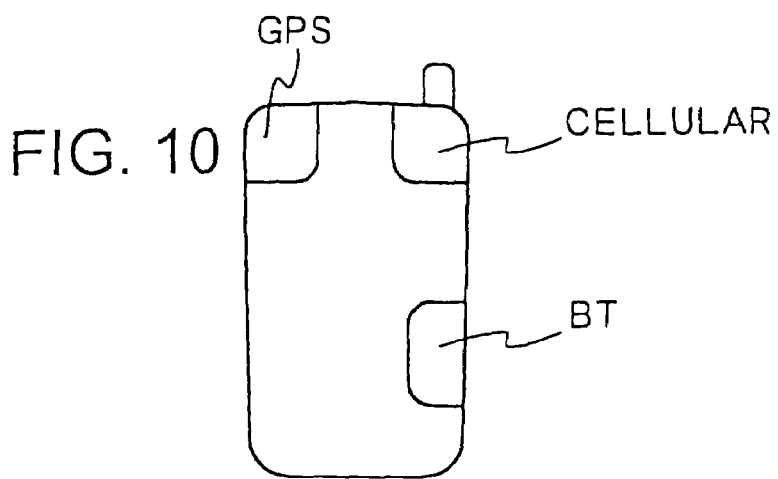
FIG. 10 is an explanatory view showing a conventional example in which antennas for four frequency bands are arranged in a portable telephone.

Furthermore, the relation between the radiation electrode and the feeding part may be a structure of multi elements single feed (MESF) in which each radiation electrode is coupled to the same feeding part as shown in FIG. 8(*a*) or a structure of single element multi feeds (SEMF) in which the feeding parts are connected at positions which match with the respective frequency bands in the reversed F antenna structure as shown in FIG. 8(*b*).

In addition, as a variation of the above embodiment of the present invention, it is possible to dispose at least one dielectric sheet on the main surface of the above radiation electrode or the multilayer structure. In addition, although AMPS/PCS is used as an example for cellular in the above example, its constitution varies according to countries. Further, combination with another frequency bands instead of the combination with the global positioning system (GPS) and BT may be used. In this case, if the filter block is constituted so as to remove other frequency bands which can be used at the same time according to the present invention, even when the combined antenna is used, it will not be affected by the noise, whereby there can be provided the antenna with high performance.

According to the present invention, since the filter block consists of the multilayer structure of the dielectric sheets while the increase in the inductance or the high-frequency resistance is not caused, there can be provided the antenna which is very small and has a high-performance filter characteristic. As a result, it can be easily mounted on the portable device such as the portable telephone or the like which is demanded for miniaturization. In addition, even if it is combined for the plural frequency bands, since the reciprocal interference can be prevented, there can be provided the very small antenna with the built-in filter for four frequency bands of cellular of dual bands, GPS and BT, for example without separately mounting a plurality of antennas in the device. Therefore, the antenna for not only cellular but also for GPS or BT can be mounted in the portable telephone or the like with small space.

Furthermore, according to the dielectric multilayer structure of the present invention, wirings provided in the dielectric layers are connected with low resistance and without increasing the inductance in the high frequency. Therefore, a high-performance filter can be obtained without using a resonator structure, which contributes to further miniaturization of the electronic devices.

INDUSTRIAL APPLICABILITY

According to the present invention, since there can be obtained a very small antenna with a built-in filter which can transmit and receive signals of a plurality of frequency bands, the high-performance antenna can be mounted on a small portable device such as a portable telephone or a personal digital assistant. Furthermore, since the antenna can be used in a plurality of frequency bands, the small portable device can be used in not only one purpose but also various kinds of purposes.

What is claimed is:

1. An antenna with a built-in filter comprising:
    a dielectric multilayer structure having a plurality of dielectric sheets, wherein at least one of the dielectric sheets includes an electroconductive film on a surface of said at least one of the dielectric sheets, the plurality of the dielectric sheets are laminated such that two or more filter blocks are formed to enable transmitting or receiving signals of two or more frequency bands; and
    a radiation element fixed to the dielectric multilayer structure and connected to said filter blocks,
    wherein a first filter block of said filter blocks is formed in a combination of any of a low-pass filter, a high-pass filter, and a band elimination filter so as to cut a first signal having a first predetermined frequency band and to pass a second signal having a second predetermined frequency band, a second filter block of said filter blocks is formed in a combination of any of a low-pass filter, a high-pass filter, and a band elimination filter so as to pass said first signal and to cut said second signal, and
    wherein said first and second signals are different in frequency bands.

2. The antenna according to claim 1, wherein said dielectric multilayer structure includes a shielding wall formed in a direction vertical to one of the plurality of dielectric sheets by a band-shaped via contact so that interference between the filter blocks is avoided.

3. An antenna with a built-in filter comprising:
    a thin and flat dielectric multilayer structure having a plurality of dielectric sheets, wherein at least one of the dielectric sheets includes an electroconductive film on a surface of said at least one of the dielectric sheets, the plurality of the dielectric sheets are laminated such that two or more filter blocks are formed to enable transmitting and receiving signals of two or more frequency bands;
    at least one radiation electrode provided on a main surface side of the dielectric multilayer structure and/or on a side surface of said dielectric multilayer structure, and
    a feeding part for supplying a signal to said radiation electrode provided on a back surface of said dielectric multilayer structure,
    wherein a first filter block is formed in a combination of any of a low-pass filter, a high pass filter, and a band elimination filter so as to cut a first signal having a first predetermined frequency band and to pass a second signal having a second predetermined frequency band, a second filter block of the filter blocks is formed in combination of a low-pass filter, a high-pass filter, and a band elimination filter so as to pass said first signal and cut second signal, and
    wherein said first and second signals are different in frequency bands.

4. The antenna according to claim 3, wherein a first electroconductive film on a surface of a first dielectric sheet of the plurality of dielectric sheets and a second electroconductive film on a surface of a second dielectric sheet of the plurality of dielectric sheets are connected through a band-shaped via contact as a plate-form connection.

5. The antenna according to claim 3, wherein said at least one radiation electrode is provided on one of the side surface or said main surface of the dielectric multilayer structure, wherein said main surface is in a vicinity of the side surface, the antenna further comprising:
    a feed electrode on one of the side surface or said main surface of said dielectric multilayer structure and coupled to said radiation electrode through capacitive coupling and the feed electrode is connected to said feeding part provided on the back surface of said dielectric multilayer structure through at least one of said filter blocks.

6. The antenna according to claim 5, further comprising:
    an earth conductor on the back surface opposite to the main surface of said dielectric multilayer structure, the earth conductor being removed in a vicinity of said at least one radiation electrode and said feed electrode.

7. The antenna according to claim 3, further comprising:
    an earth conductor on the main surface of said dielectric multilayer structure in an area outside of the vicinity of said at least one radiation electrode; and
    a feed electrode to be connected to the at least one radiation electrode, wherein said feed electrode is on a portion of the main surface lacking said earth conductor.

8. The antenna according to claim 7, wherein one of the at least one radiation electrode is on a side of the main surface of said dielectric multilayer structure through an insulating support and a space and, the one of the at least one radiation electrodes is connected to said feed electrode and to the earth conductor of said dielectric multilayer structure such that the one of the at least one radiation electrode is impedance matched.

9. The antenna according to claim 3, wherein two or more of the at least one radiation electrode are provided in at least two positions on two opposite side surfaces of said dielectric multilayer structure and the main surface side of said dielectric multilayer structure to receive signals of at least two frequency bands, wherein said two or more filter blocks of the at least first and second filter blocks are electrically coupled to the respective two or more radiation electrodes.

10. The antenna according to claim 9, wherein a first radiation electrode of the at least one radiation electrode formed on the side surface of the dielectric multilayer structure or the main surface of the dielectric multilayer structure in the vicinity of the side surface is for a global positioning system or Bluetooth, and a second radiation electrode of the at least one radiation electrode provided on said main surface side of the dielectric multilayer structure and connected to the feed electrode is for a cellular system.

11. The antenna according to claim 3, wherein said radiation electrode is formed of a folded antenna element said folded antenna element having at least two portions such that adjacent elements are electrically coupled wherein the folded antenna element is formed to resonate in predetermined frequency bands by adjusting the electrically coupled portion, so that one end of said folded antenna element is connected to filter blocks corresponding to the predetermined frequency bands through a multiplexer.

12. The antenna according to claim 3, wherein said dielectric multilayer structure includes a shielding wall formed in a direction vertical to a one of the plurality of dielectric sheets by a band-shaped via contact so that interference between the filter blocks is avoided.

13. The antenna according to claim 8, wherein said at least one radiation electrode has a dual band capability for use in cellular systems.

* * * * *